United States Patent [19]

Hotchkiss

[11] 4,104,703
[45] Aug. 1, 1978

[54] TERMINAL BLOCK COVER FOR COVERING BLOCK AND SPACE BETWEEN ADJACENT BLOCKS

[75] Inventor: Kenneth W. Hotchkiss, Golden, Colo.

[73] Assignee: Proto Production Plastics, Inc., Boulder, Colo.

[21] Appl. No.: 718,886

[22] Filed: Aug. 30, 1976

[51] Int. Cl.² ............... H02B 1/06; H01B 17/00
[52] U.S. Cl. ............... 361/426; 361/428; 174/138 F; 174/72 A; 339/198 J
[58] Field of Search ......... 361/334, 331, 344, 426, 361/428; 174/72 A, 66, 67, 50.51, 138 F; 339/198 J

[56] References Cited

U.S. PATENT DOCUMENTS

| 3,002,177 | 9/1961 | Bundy | 339/198 J |
| 3,763,401 | 10/1973 | Ransom | 174/72 A X |
| 3,836,826 | 9/1974 | Hotchkiss et al. | 361/331 X |
| 3,906,146 | 9/1975 | Taylor | 174/72 A |

*Primary Examiner*—J D Miller
*Assistant Examiner*—Peter S. Wong
*Attorney, Agent, or Firm*—Kyle W. Rost

[57] ABSTRACT

A cover for an open face terminal block, with or without a distributor panel adjacent one end of the block, for telephone installation equipment, said cover comprising a flat top which overlies the open face of the terminal block, or overlies said block and distributor panel, and extends sidewise beyond the side walls of the block, snap tabs depending from the inner surface of the flat top inwardly of the side edges of the top in positions which provide frictional engagement of the snap tabs with the side walls of the terminal block when the cover is pressed down on the block, and, if a distributor panel is present, distributor panel engaging means located on the inner surface of the cover top in the area located outwardly of the terminal block side walls, said cover covering adjacent blocks and space between them whereby tops and sides of the blocks are protected.

5 Claims, 4 Drawing Figures

TERMINAL BLOCK COVER FOR COVERING BLOCK AND SPACE BETWEEN ADJACENT BLOCKS

BACKGROUND OF THE INVENTION

This invention relates to terminal block covers which can be used to cover terminal blocks, or combined terminal blocks and distribution panels, that are parts of telephone installation equipment. Such terminal blocks and distribution panels frequently are used together, but not necessarily. However, the cover disclosed herein can be used for most installations and are made to cover spaces between adjacent blocks and between distribution panels heretofore left uncovered, whereby the external surfaces of the blocks and panels have remained unprotected against injurious contact with other objects.

PRIOR ART

Terminal blocks and covers therefor used in telephone installation equipment have been disclosed in U.S. Pat. No. 3,836,826, granted Sept. 17, 1974, to Kenneth W. Hotchkiss, et al., and in U.S. Pat. No. 3,966,074 granted June 29, 1976 to Kenneth W. Hotchkiss et al. The prior art fails to reveal terminal block covering means whereby such blocks and spaces between them are covered and protected, and fails to disclose covering means which are mounted on and extend over both the terminal blocks and adjacent distribution panels, if any, in engagement with side walls of the terminal blocks and upper portions of mushroom pins used in such distribution panels.

SUMMARY OF THE INVENTION

The terminal block covers of this invention are generally rectangular in shape and of sufficient area to cover an adjacent terminal block and distribution panel and at least part of any space between adjacent terminal blocks and between adjacent panels. For this purpose, the cover top is provided on its inner surface with snap tabs for engaging terminal block side walls and with additional means for engaging the mushroom pins of a distribution panel adjacent one end of the terminal block. Said additional means for engaging the mushroom pins comprise a snap tab and a T-unit located relatively to each other in such positions that the snap tab engages the circumferential edge of the top of the mushroom pin, and the T-unit engages said pin by entering a central bore which is part of such pins. The cover top extends beyond the side edges of the terminal block and adjacent distribution panel, if any, to cover spaces between blocks and between panels. The distribution panel is wider than the terminal block, and therefore the mushroom pin engaging means are located on the block top inner surface in its space-overhanging area while the snap tabs for engaging the side walls of the terminal block are located inwardly in line with said side walls. The snap tabs perform their engaging functions when the cover as a whole is pressed down on the block side walls and adjacent mushroom pin panel.

DESCRIPTION OF THE PREFERRED EMBODIMENT

Figure 1:
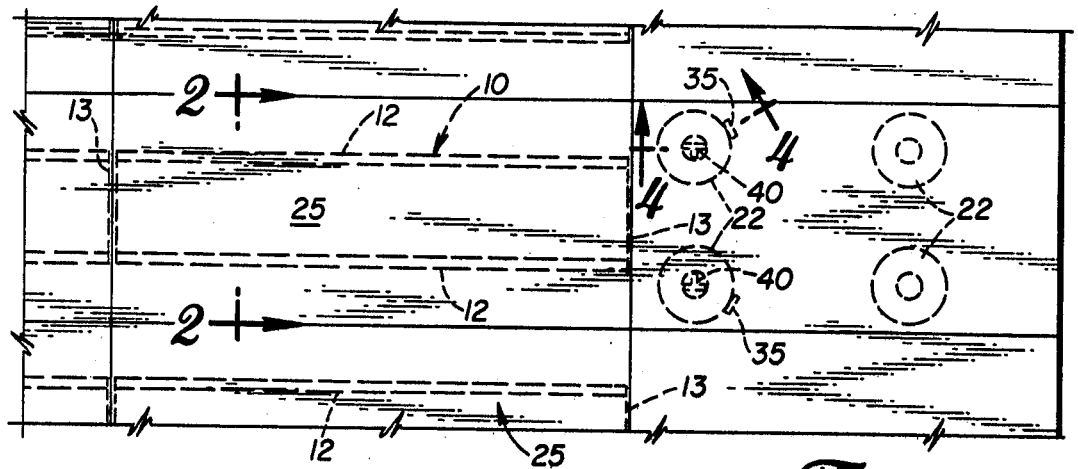
FIG. 1 is a top plan view of a terminal block and adjacent distribution panel with mushroom pins thereon, and a cover therefor embodying this invention.
Figure 2:
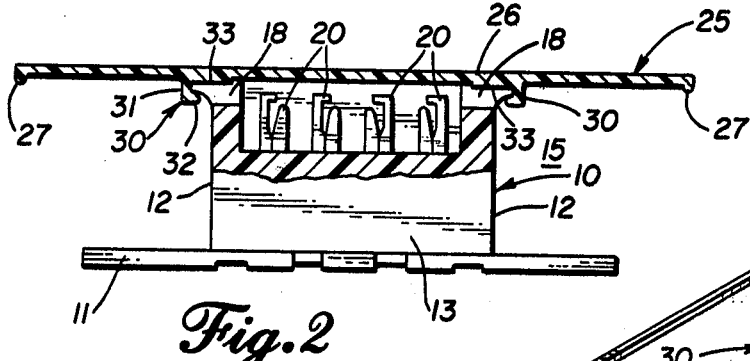
FIG. 2 is a transverse sectional view, on an enlarged scale, in the plane of the line 2—2 of FIG. 1.

Referring to FIGS. 1 and 2, a terminal block 10 is mounted on a rectangular base 11 having an area large enough to support one or more blocks. The blocks 10 usually are placed in parallel relationship, with some space between their side walls 12. End walls are designated 13. In FIG. 2, space adjacent the side wall 12 is indicated at 15. Thickened flat top members 18 are parts of the terminal block side walls 12, as is known in the art, and connectors 20 are mounted in the box between said side walls.

A distribution panel located adjacent an end 13 of the terminal block is provided with a plurality of mushroom pins 22, as shown in FIG. 1. The block 10 and panel with pins 22 are used together in telephone installation equipment, but sometimes the block 10 is used without the distribution panel. The cover 25, about to be described, can be used to cover both block and panel, or only the block without the panel.

The cover 25 comprises a top 26 and slightly thickened or depending side edges 27 and end members 28; the latter being formed in spaced sections to assure a desired degree of flexibility of the cover 25 as a whole.

Figure 3:
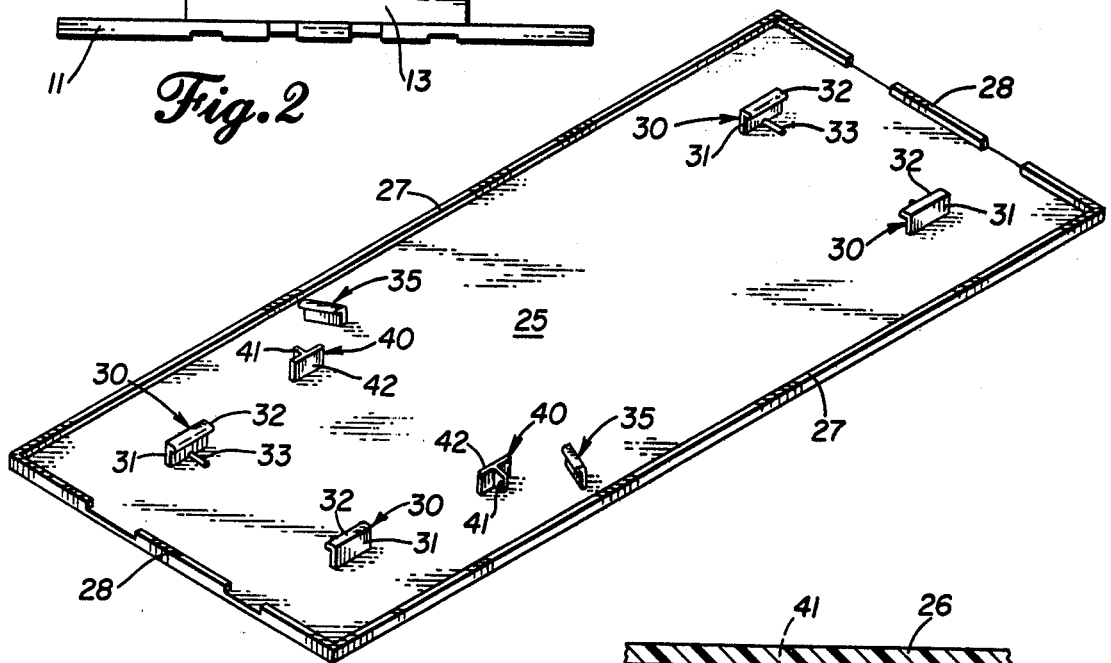
FIG. 3 is a perspective view of the inner surface of the cover removed from the block and panel shown in FIG. 1.

As shown in FIG. 3, the inner surface of the top 26 of cover 25 is provided with four snap tabs 30, two located opposite each other near one end 28 and another two located opposite each other near the other end 28 of the cover. Each snap tab 30 comprises a member 31 perpendicular to the top 26 having an overhanging portion 32 inwardly directed toward the opposite snap tab 30, the member 31 being firmly connected to the cover top 26. A short rib 33 extends laterally on the cover top 26 from each perpendicular member 31 and aids in holding the cover 25 in place on the block 10. The four snap tabs 30 are located to engage the thickened side wall portions 18 as shown in FIG. 2.

Figure 4:
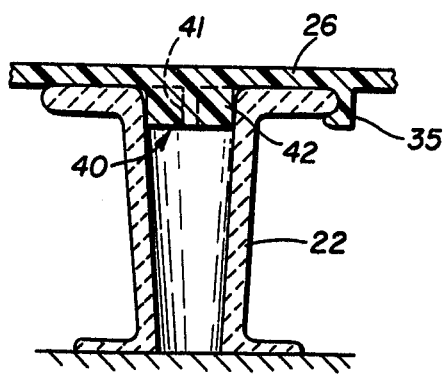
FIG. 4 is an enlarged sectional view in the plane of the line 4—4 of FIG. 1.

Between the two sets of snap tabs 30, near one of them and laterally outwardly thereof, the cover 25 is provided with two sets of mushroom pin engaging devices, each set comprising a snap tab 35 and a T-unit 40. The snap tabs 35 consist of the perpendicular member 31 with overhanging part 32 heretofore described as parts of snap tabs 30. The T-units 40 consist of a stem 41 and cross member 42 on one end of the stem 41 perpendicular to the top 26. Each set of devices 35 and 40 engages a mushroom pin 22 on the distribution panel shown adjacent one end of the block 10 in FIG. 1. As best shown in FIG. 4, the snap tab 35 engages the circumferential edge of pin 22 and the T-unit 40 enters a bore in pin 22 and engages the surrounding area of the pin.

It will be understood that while the cover 25 of FIG. 3 fits most installations of combined terminal blocks and distributor panels, the length of the covers may be varied, and the snap tabs 30 may be located to engage block side walls of different length blocks; further short covers provided with sets of snap tabs 35 and T-units 40 may be used for protecting distributor panels.

I claim:

1. An improved terminal block cover for use in telephone installation equipment and the like of the kind wherein a base carries a plurality of terminal blocks in parallel, spaced rows having fixed, predetermined sidewise spacing between adjacent, independent, parallel terminal blocks, each terminal block having parallel longitudinal side walls, wherein the improved cover comprises:

(a) a flat top that overlies the open face of a terminal block and extends sidewise for a greater width than the distance between said parallel longitudinal side walls, a first portion of the top extending sidewise at a first side of the terminal block for a predetermined first distance, and a second portion of the top extending sidewise on a second and opposite side of the terminal block for a second predetermined distance, said first and second predetermined distance substantially equalling the predetermined distance between said adjacent parallel terminal blocks for cooperative full coverage of the space between adjacent, parallel, independent terminal blocks by a pair of said terminal block covers on adjacent terminal blocks; and (b) a plurality of snap tabs depending from the inner surface of the flat top inwardly of the side edges of the flat top in positions providing frictional engagement of the snap tabs with said side walls of the terminal block when the cover is pressed against the block.

2. An improved terminal block and distribution panel cover for use in telephone installation equipment and the like, wherein a base carries a distribution panel with a plurality of mushroom pins thereon and normal thereto at predetermined spacing intervals and also carries a plurality of terminal blocks in parallel rows having fixed, predetermined sidewise spacing between adjacent, independent, parallel terminal blocks, each terminal block having parallel longitudinal side walls, the parallel rows of terminal blocks running normally to the distribution panel and terminating adjacent to the distribution panel at one end of each row, the predetermined spacing of the parallel rows of terminal blocks corresponding to the spacing of the mushroom pins such that a pair of mushroom pins is spaced on the distribution panel with one pin near each of the opposite longitudinal sides of each row of terminal blocks, wherein the improved cover comprises:

(a) a flat top of width greater than the width of one of said terminal blocks and greater than the distance between the opposite edges of said pair of mushroom pins at the end edge of the terminal block, a first portion of the top extending sidewise at a first side of the terminal block for a predetermined first distance, and a second portion extending sidewise at a second and opposite side of the terminal block for a second predetermined distance, said first and second predetermined distances substantially equalling the predetermined distance between said adjacent parallel terminal blocks for cooperative full coverage of the space between adjacent, parallel, independent terminal blocks by a pair of said terminal block covers on adjacent terminal blocks;

(b) a plurality of snap tabs depending from the inner surface of the flat top inwardly of the flat top side edges in positions providing frictional engagement of the snap tabs with the side walls of the terminal block when the cover is pressed against the block; and (c) mushroom pin engaging means located on the inner surface of the flat top on said first and second portions of the top for frictionally engaging the top to a pair of mushroom pins.

3. The improved cover of claim 2, wherein said pair of mushroom pins at the end of each row of terminal blocks is spaced with the longitudinal axes of the pins at a greater relative distance than the opposite longitudinal sides of the associated terminal block, the axes being relatively outside the longitudinal sides of the associated terminal block, and each mushroom pin having a cavity at the top end thereof along its axis, wherein said mushroom pin engaging means comprises cavity engaging members depending from said first and second portions of the top for engaging said mushroom pins within said axial cavities.

4. The improved cover of claim 3, wherein said mushroom pin engaging means further comprises snap tabs depending from said first and second portions of the top for cooperating with said cavity engaging members to hold the cover against the tops of the mushroom pins.

5. The improved cover of claim 3, wherein said cavity engaging members comprise a pair of T-units, one on each of said first and second top portions, with the cross-bars of the T-units extending in a mutually parallel direction and parallel to the rows of parallel terminal blocks, and the stem of each T-unit extending normally to the cross-bar from the side of the cross-bar opposite from the other T-unit of the pair.

* * * * *